(12) United States Patent
Morishita

(10) Patent No.: US 6,707,066 B2
(45) Date of Patent: Mar. 16, 2004

(54) RADIATION IMAGE PICK-UP DEVICE

(75) Inventor: Masakazu Morishita, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 314 days.

(21) Appl. No.: 09/985,534

(22) Filed: Nov. 5, 2001

(65) Prior Publication Data

US 2002/0079493 A1 Jun. 27, 2002

(30) Foreign Application Priority Data

Nov. 7, 2000 (JP) ........................................ 2000-339298

(51) Int. Cl.[7] .......................... H01L 31/20; H01L 29/04
(52) U.S. Cl. .......................... 257/59; 257/72; 257/222; 257/234; 257/291
(58) Field of Search ..................... 257/59, 68, 71, 257/72, 222, 234, 291, 292, 444, 443; 348/308, 302, 298; 250/370.08, 370.09, 370.11

(56) References Cited

U.S. PATENT DOCUMENTS

| | | | |
|---|---|---|---|
| 5,818,898 A | * 10/1998 | Tsukamoto et al. | 378/98.8 |
| 5,965,872 A | 10/1999 | Endo et al. | 250/208.1 |
| 6,075,256 A | * 6/2000 | Kaifu et al. | 257/72 |
| 6,243,441 B1 | * 6/2001 | Zur | 378/98.7 |

\* cited by examiner

Primary Examiner—Minhloan Tran
Assistant Examiner—Tan Tran
(74) Attorney, Agent, or Firm—Fitzpatrick, Cella, Harper & Scinto

(57) ABSTRACT

There is provided a radiation image pick-up device with a large size, in which detection efficiency, light utilization efficiency, and a yield can be improved, high speed operation can be realized, and a signal to noise ratio is improved. The radiation image pick-up device includes a phosphor for converting radiations into light, a semiconductor layer for converting the radiations into charges and converting the light from the phosphor into charges, TFTs for reading signals corresponding to stored charges, and output lines for outputting the charges read by the TFTs. The semiconductor layer, charge storage capacitors, the TFTs, and the output lines are formed respectively on an insulating substrate. The phosphor is laminated on the semiconductor layer and the semiconductor layer is laminated on a formation surface of the charge storage capacitors, the TFTs, and the output lines respectively on the insulating substrate. The semiconductor layer is electrically connected with the charge storage capacitors on the insulating substrate through connection electrodes.

16 Claims, 16 Drawing Sheets

RADIATION IMAGE PICK-UP DEVICE

BACKGROUND OF THE INVENTION

1. Field of the Invention

The present invention relates to a radiation image pick-up device, and particularly to a radiation image pick-up device which can be suitably used for an X-ray image pick-up device for image pick-up of a human body by X-ray irradiation.

2. Related Background Art

Conventionally, there is an X-ray sensor having a structure in which a phosphor for converting an incident X-ray into light and a photosensor for detecting the light from the phosphor are laminated. A large number of photosensors such as a photosensor using a PIN type diode and a photosensor using an MIS type sensor as disclosed in U.S. Pat. No. 6,075,256 and the like are proposed and actually commercialized.

Currently, there are various needs such as high definition image taking and moving image taking. In order to satisfy these needs, it is required that X-ray detection efficiency, light utilization efficiency, a yield, high speed operation, a signal to noise ratio, and the like be further improved.

SUMMARY OF THE INVENTION

The present invention has been made in view of the above problems, and an object of the present invention is therefore to provide a radiation image pick-up device with a large size, in which detection efficiency, light utilization efficiency, and a yield can be improved, high speed operation can be realized, and a signal to noise ratio is improved, as compared with a conventional used device.

According to the present invention, a radiation image pick-up device for performing image pick-up by using radiation includes:

a plurality of input pixels, each having a wavelength converter for converting incident radiation into light, conversion means for converting the incident radiation and the light converted by the wavelength converter into charge, charge storage means for storing the converted charge, and read means for reading a signal corresponding to the charge stored in the charge storage means, and a plurality of output lines for outputting charges read from the input pixels, which are connected with the plurality of input pixels.

Since both the wavelength conversion means (phosphor) and the charge conversion means (semiconductor detector) are used, the detection efficiency can be increased.

Also, the radiation image pick-up device further includes a first reset means for resetting the charge in the charge storage means.

Also, the plurality of input pixels, the output lines, and the first reset means are formed respectively on an insulating substrate, the first reset means includes a thin film transistor, and each of the input pixels includes a read thin film transistor.

Also, the reset thin film transistor and the read thin film transistor are made of non-single crystalline semiconductor.

Also, the radiation image pick-up device further includes a transparent electrode which is located between the wavelength conversion means and the charge conversion means and transmits the light converted by the wavelength conversion means.

Also, the charge conversion means has a semiconductor substrate for converting radiation into charge and a plurality of divided electrodes provided in correspondence with the plurality of input pixels formed on an insulating substrate, the semiconductor substrate and the insulating substrate are laminated, and the plurality of dividing electrodes and storage capacitors of the plurality of pixels are electrically connected with each other.

Also, the radiation image pick-up device further includes amplifiers for signal amplification in the output lines.

Also, the charge conversion means is formed on a semiconductor substrate and has a pn junction portion.

Also, the charge conversion means has an energy band gap with a band gap of at least 1 eV or larger.

Also, the radiation image pick-up device further includes a second reset means for resetting the output lines, which is connected with the output lines.

Also, the read means is composed of a thin film transistor made of non-single crystalline semiconductor.

Also, the charge storage means and the read means are formed on an insulating substrate in the same layer structure having a lower electrode, a dielectric film, a high resistance semiconductor layer, a low resistance semiconductor layer, and an upper electrode.

Also, the charge conversion means is made of semi-insulating semiconductor.

Also, the wavelength conversion means includes a phosphor.

Also, the radiation image pick-up device further includes a reflective layer in a radiation incident side of the wavelength conversion means.

Also, a thickness of a high concentration impurity region composing the charge conversion means is set to be ⅕ of an absorption ratio or less.

The details will be described in embodiment modes of the present invention.

DETAILED DESCRIPTION OF THE PREFERRED EMBODIMENTS

Figure 1:
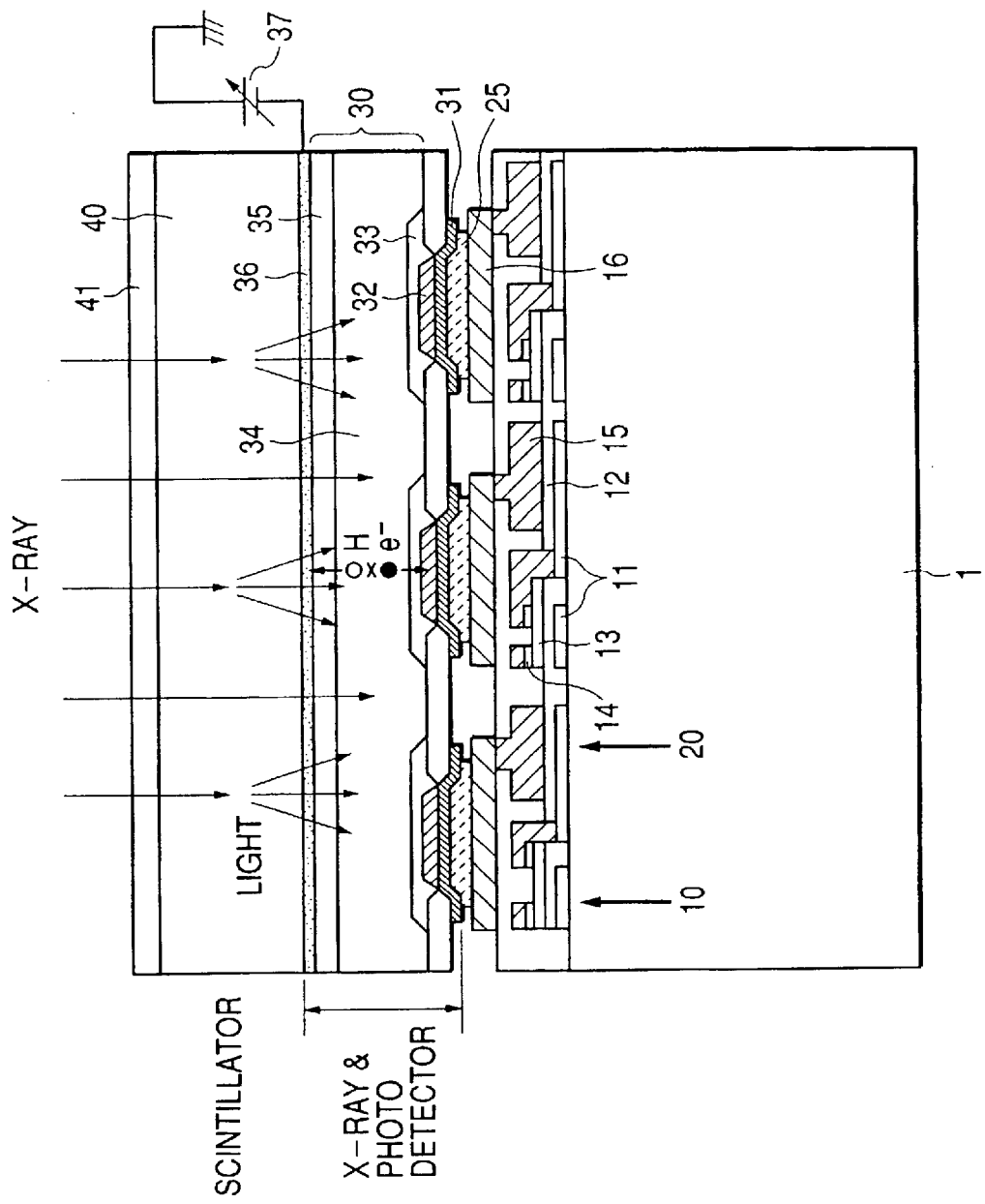
FIG. 1 is a cross sectional view indicating a schematic structure of a radiation image pick-up device of an embodiment mode of the present invention.

An embodiment mode of the present invention will be described in details with reference to the drawings.

One embodiment mode of the present invention will be described with reference to FIG. 1. An array of thin film transistors (hereafter referred to as TFTs) 10 as switching elements and charge storage capacitances 20 as capacitances for charge storage are formed on an insulating substrate 1 made of glass. Reset transistors, read transistors, and the like, which are described later, are made from the thin film transistor. The charge storage capacitances are provided for storing charges converted by a charge converter 30. A semiconductor layer 30 is formed and laminated over various semiconductor elements including the TFTs 10 on the insulating substrate 1. The semiconductor layer 30 absorbs X-rays and directly converts them into carriers. It also converts lights converted by a scintillator into charges. A phosphor 40 as a wavelength converter is laminated over the semiconductor layer 30.

In the radiation image pick-up device of the present invention, a portion of irradiated radiations is absorbed by a wavelength converter made up of the phosphor 40 and lights H emitted from the phosphor are absorbed in the semiconductor layer 30. Also, X-rays transmitted through the phosphor 40 are absorbed in the semiconductor layer 30. Thus, X-ray absorption efficiency can be improved and incidence efficiency of lights from the phosphor 40 can be increased.

A structure will be further described in details. Lower electrodes 11 for the TFTs 10 and the charge storage capacitances 20, dielectric films 12 for the TFTs 10 and the charge storage capacitances 20, high resistance semiconductor layers 13 of the TFTs 10, low resistance semiconductor layer 14, upper electrodes 15, and lead electrode layers 16 for leading charges from the charge storage capacitances 20 are formed on the insulating substrate 1. From the above structure, the TFTS array and the charge storage capacitances 20, which are described above, are formed on the insulating substrate 1. A semiconductor material such as amorphous silicon or polysilicon for a large area sensor is suitable as a material for the TFTs 10.

It is preferable to use an insulating substrate as the substrate, since a parasitic capacitance between a wiring and the substrate is reduced and thus high speed operation is enabled as compared with the case where single crystalline or the like is used. A processing means for processing charges produced by radiations is composed of them.

The semiconductor layer 30 for converting both lights and X-rays transmitted through the wavelength converter into charges and detecting them is composed of electrodes 31 divided into respective pixels, low resistance semiconductor regions 32 having a p-type or an n-type and a high impurity concentration, semiconductor regions 33 having a p-type or an n-type and a lower impurity concentration than the low resistance semiconductor regions 32, a high resistance semiconductor region 34, a semiconductor region 35 having an n-type or a p-type and a high impurity concentration, and a transparent electrode 36. Here, it is required that the transparent electrode 36 is made of a material which transmits the radiations transmitted through the wavelength converter and the light converted by the wavelength converter. Although described later, it is required that this electrode is provided in the case where a voltage is applied to the semiconductor layer. A semiconductor single crystal such as GaAs, CdTe, CdZnTe, GaP, or Si is suitable as the semiconductor material. Although described later, the semiconductor region 35 having a high impurity concentration becomes a dead band in a photo sensor. Thus, this region is preferably formed thin.

The semiconductor layer 30 and the charge storage capacitors 20 on the insulating film 1 are connected with each other through connection electrodes 25 in both an electrical aspect and a mechanical aspect. In order to provide an pn junction of the semiconductor layer 30 with a reverse bias to form a depletion layer, the semiconductor layer 30 is also connected with a power source 37 through an electrode 36. The phosphor 40 is laminated over the semiconductor layer 30, that is, in an X-ray incident side. A layer 41 which serves as a reflective layer for effectively leading the lights H to the semiconductor layer 30 is preferably formed on the phosphor 40.

Thus, when the TFTS array, output lines, and the like are formed on the insulating substrate 1 to construct a read circuit and the phosphor 40 and the semiconductor layer 30 are laminated, an area for detecting radiations becomes larger. Therefore, the radiation image pick-up device with a large size can be manufactured. Also, a degree of freedom in a design of the TFTS array is increased and an on resistance can be decreased. Therefore, high speed operation (30 frames per second or more) is realized.

Figure 8:
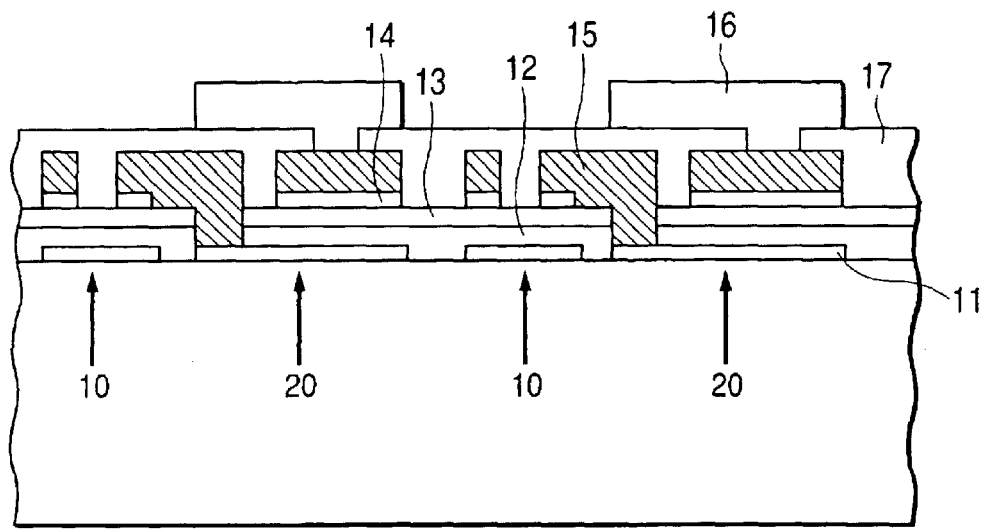
FIG. 8 is a cross sectional view indicating the case where TFTs and capacitors are formed in the same layer in another embodiment mode.

Further, as shown in FIG. 8, the TFTs 10 and the charge storage capacitors 20 on the insulating substrate 1 may be formed in the same layer structure. In the case of this structure, a manufacturing process is simplified. Also, preferable effects can be obtained in terms of cost, yield, and the like. In FIG. 8, reference numeral 17 denotes a protective film for the TFTs 10 and the charge storage capacitors 20.

When an absorption coefficient of the phosphor 40 in effective X-ray energy is given by $\mu 1$, a thickness of the phosphor is given by W1, an X-ray absorption coefficient of the semiconductor in effective X-ray energy is given by $\mu 2$, and a thickness of the semiconductor is given by W2, X-ray detection efficiency (X-ray absorption efficiency) in effective X-ray energy can be approximately represented by the following equation:

$$\text{detection efficiency} = (1-\exp(-\mu 1 W1)) + \exp(-\mu 1 W1)(1-\exp(-\mu 2 W2))$$

Figure 2:
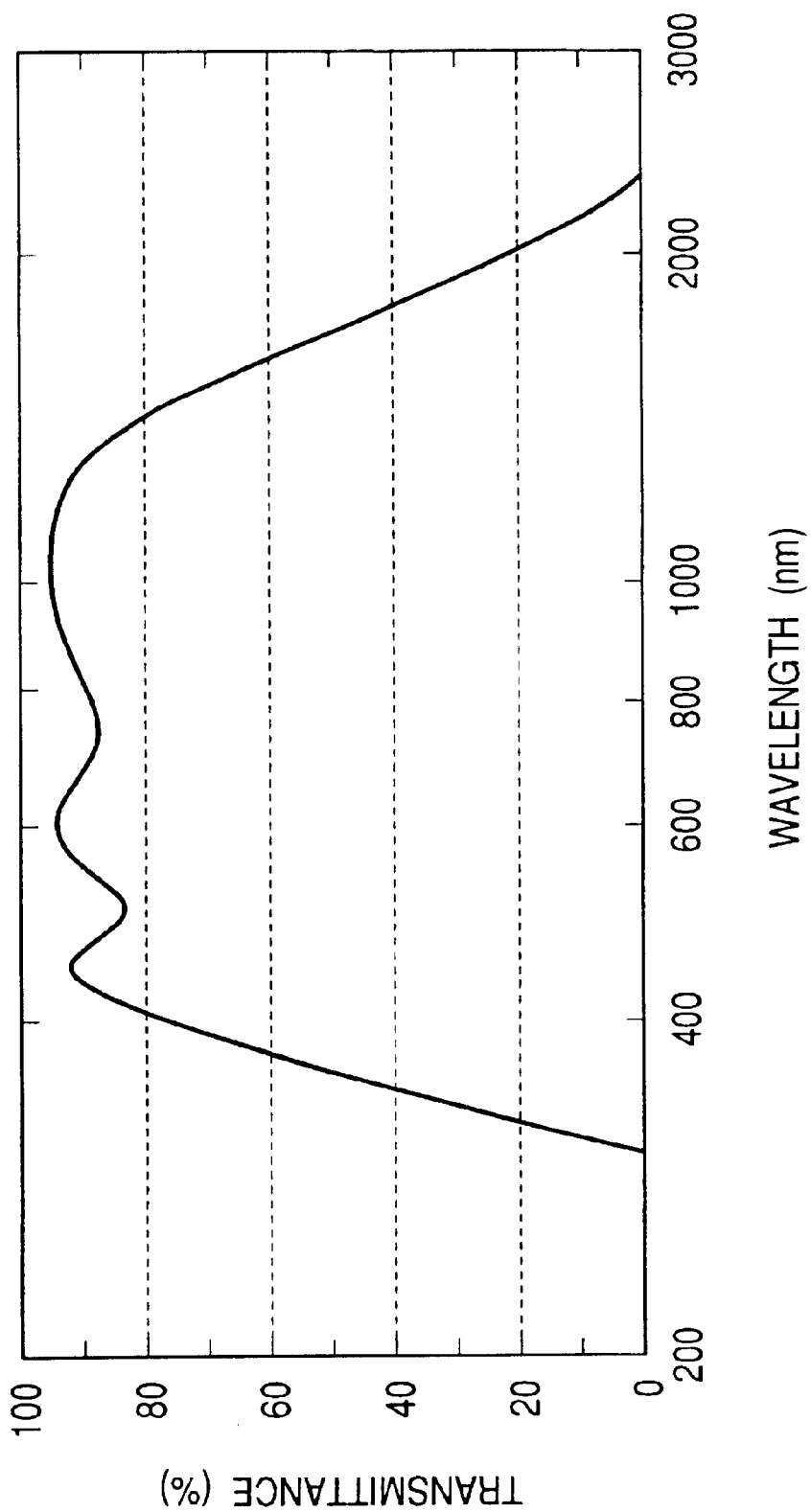
FIG. 2 is an explanatory graph showing light transmittance data in a state in which a transparent conductive film is deposited on a glass substrate in the embodiment mode of the present invention.

FIG. 2 is an explanatory graph showing light transmittance data in a state in which a transparent conductive film used as the electrode 36 is deposited on a glass substrate.

The abscissa indicates an optical wavelength (nm) and the ordinate indicates transmittance (%). Transmittance of about 90% is obtained in a wavelength range of about 400 nm to about 1300 nm. Although described later, a material having high transmittance with respect to light of a wavelength region converted by the wavelength converter is preferable and a material having high transmittance with respect to light with a wavelength of 400 nm to 600 nm is preferable. An example of the transparent electrode material having transmittance as shown in FIG. 2 includes indium oxide ($In_2O_3$:Sn) to which tin is added.

Figure 3:
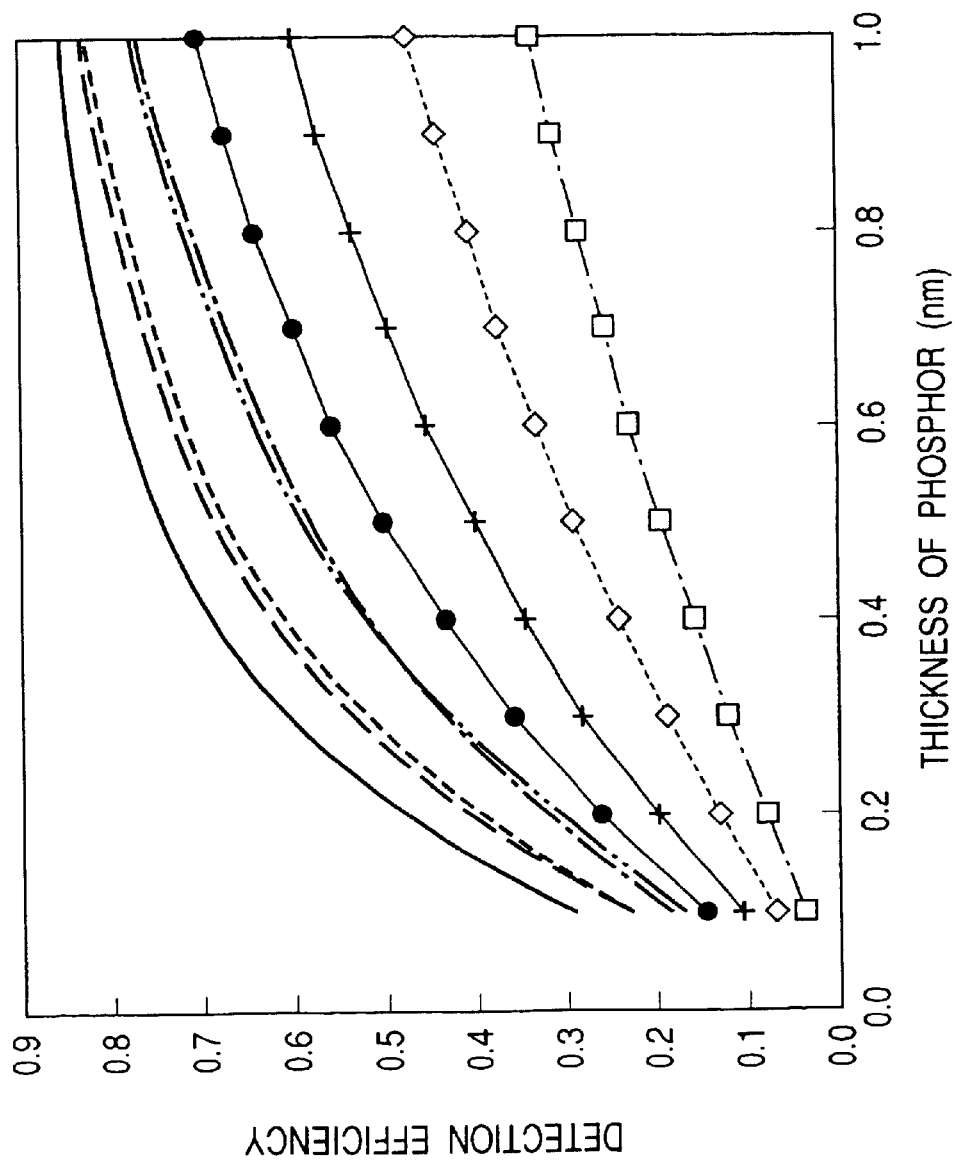
FIG. 3 is an explanatory graph showing calculation results of X-ray detection efficiency with respect to thicknesses of various phosphors under a condition in which tungsten is used as a target and an accelerating voltage of electron is set to be 120 kV.

FIG. 3 is an explanatory graph showing calculation results of X-ray detection efficiency (which efficiency is substantially proportional to an absorption amount) to thicknesses of various phosphors under a condition in which tungsten (W) is used as a target and an accelerating voltage of electron is set to be 120 kV in an X-ray generation apparatus. In order to improve the X-ray detection efficiency, it is necessary to increase the thickness of the phosphor 40. In FIG. 3, calculations are made for respective materials at a filling factor of 100%.

The phosphor 40 is generally formed in a layer structure by mixing crystal grains and bonding materials. Thus, since it is not formed at a filling factor of 100%, when the thickness of the phosphor 40 shown in FIG. 3 is divided by a coefficient of the filling factor, the thickness of the phosphor that is actually used can be obtained. Generally, the filling factor is about 50%.

The thickness of the phosphor layer using crystal grains is preferably about the same as the pitch of X-ray detection cells or less. This is because the expansion of light substantially becomes about the same as the thickness. Since the expansion of light is dependent on the thickness of the phosphor layer, if the phosphor layer is thicker than the pitch, the X-ray absorption efficiency is increased. However, since the expansion of light becomes large, resolution that can be obtained by utilizing the pitch of an X-ray detector is not obtained.

In the case of an X-ray detector having a pitch of, for example, 200 μm, when an filling factor is 50% in GOS and a thickness of the phosphor layer is set to be 200 μm, this becomes roughly equivalent to a phosphor having a thickness of 0.1 mm in GOS shown in FIG. 3 and thus the detection efficiency becomes 30%. Therefore, lights corresponding to the remainder of 70% transmit the phosphor layer.

Here, in order to convert a large amount of radiation into lights by the wavelength converter, it is possible to thicken the wavelength converter. However, high X-ray detection efficiency cannot be set because of the limitation imposed by required optical resolution. This is because there is a contradictory relationship between the X-ray detection efficiency and the optical resolution in the phosphor. Also, if the phosphor is thickened, the absorption and the scattering of lights produced by X-ray detection are caused in the phosphor and thus an amount of light led to an external is gradually decreased. Therefore, it is difficult to dramatically improve the radiation detection efficiency by a method of detecting radiations using only the phosphor. However, according to a structure of the present invention, since a conversion means for directly converting radiations transmitted through the wavelength converter into charges is provided, the detection efficiency can be improved.

TABLE 1

| Phosphor | Light Emission Color | Wavelength (nm) | Efficiency (%) | Atomic Number (Effective) |
|---|---|---|---|---|
| $CaWO_4$ | Blue | 425 | 5 | 61.8 |
| $Gd_2O_2S$ | Green | 545 | 13 | 59.5 |
| BaFBr:Eu | Purple | 390 | 16 | 48.3 |
| CsI:Na | Blue | 420 | 10 | 54 |
| CsI:Tl | Green | 575 | 11 | 54 |

Table 1 is an explanatory view indicating kinds, light emission colors, peak wavelengths, and light emission energy efficiencies of the phosphor 40. Colors of lights emitted from the phosphor 40 are light emission colors ranging from a green color to a purple color and the efficiency is about 5% to 20%. The selection of a light emission material is particularly important. Thus, it is required that X-ray detection efficiency, light emission efficiency, and a light emission wavelength with respect to the thickness of the phosphor layer are selected by wavelength-dependent detection efficiency of a layer for converting lights into charges.

That is, it is necessary to consider light transmittance of a window material as shown in FIG. 2 and further the wavelength-dependent detection efficiency of a light detection material. In view of the light emission wavelength, a light emission material for a green color is more preferable than a light emission material for a purple color and a light emission material for a blue color, which have a short wavelength. The determination is preferably made based on efficiency and a light receiving rate of a photo detector.

In the case of, for example, GdOS:Tb and CsI:Tl, a light emission wavelength corresponds to a green color, high detection efficiency can be obtained even in the case where the phosphor is thin, and the light receiving efficiency of the charge conversion means can be also increased. Thus, these are optimum materials for the phosphor. Note that there are various semiconductor materials for detecting both X-rays and lights, as shown in FIG. 1.

Figure 4:
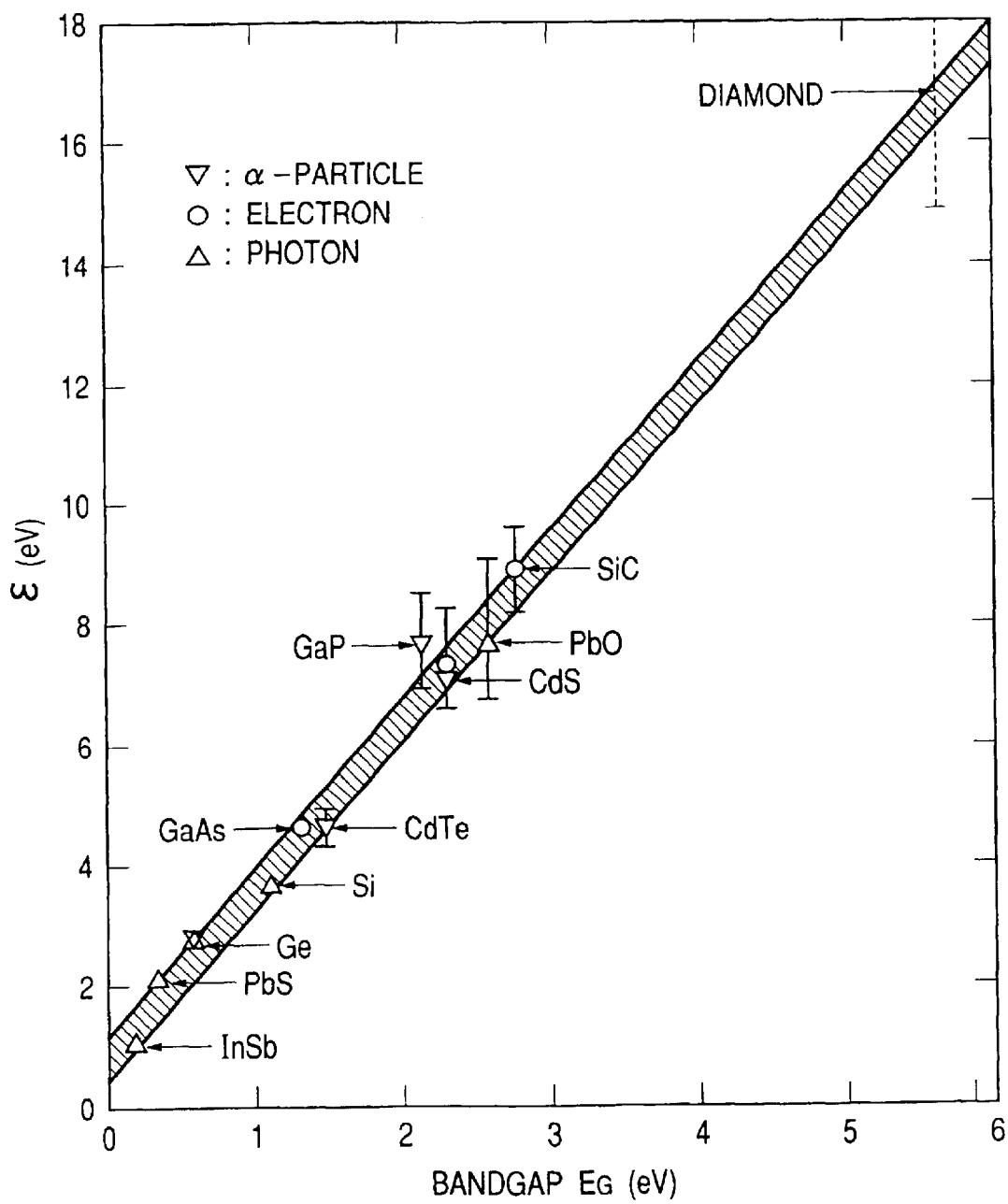
FIG. 4 is an explanatory graph indicating energy required for producing a pair of electron and hole in a semiconductor in the case where X-rays are made incident upon a semiconductor material in the embodiment mode of the present invention.

FIG. 4 is an explanatory graph indicating energy ε required for producing a pair of electron and hole in a semiconductor in the case where X-rays are made incident upon a semiconductor material. An empirical relationship between energy ε and a band gap Eg can be given as $$\epsilon = 2.67 Eg + 0.87 \ (eV) \tag{2}$$

Figure 5:
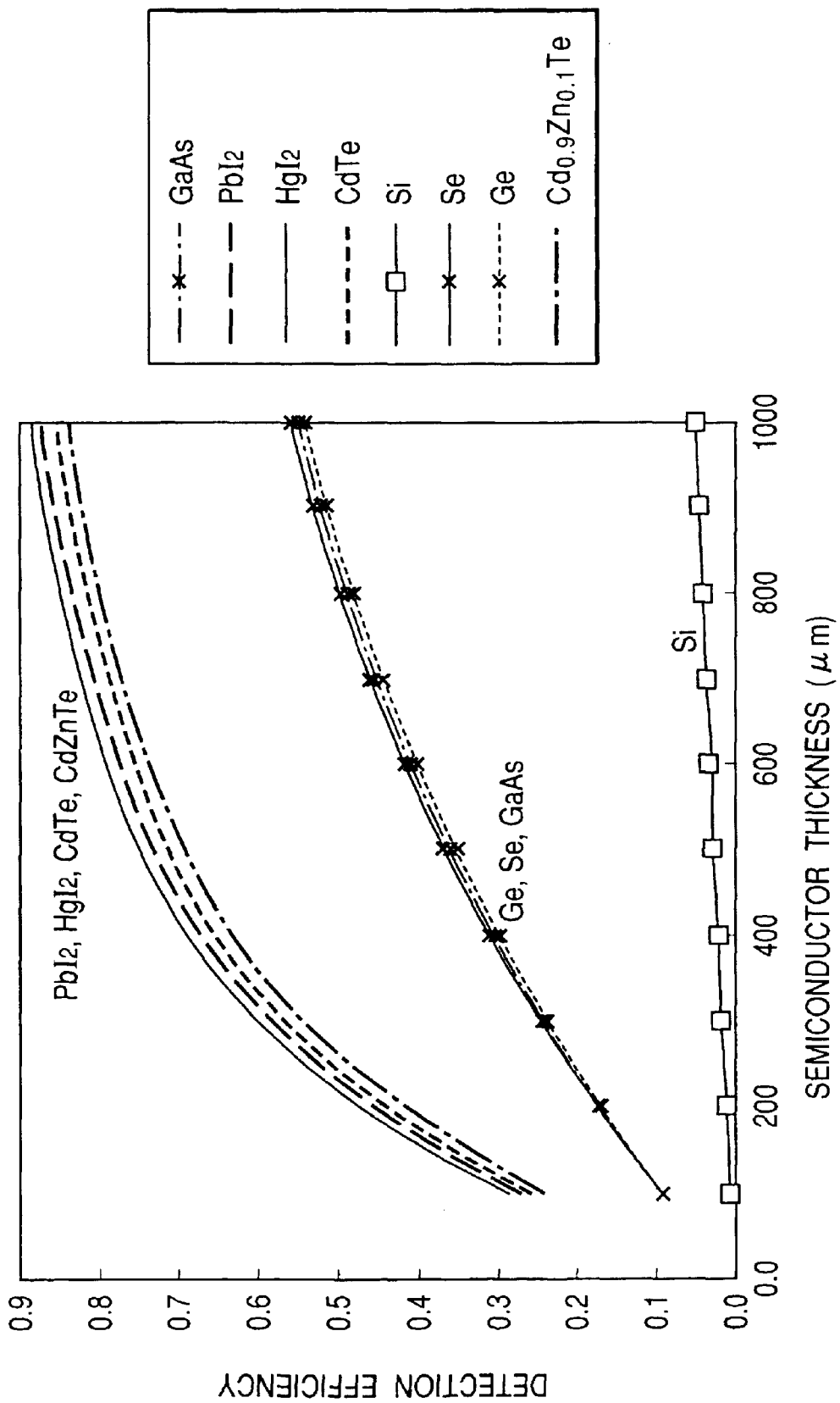
FIG. 5 is an explanatory graph showing detection efficiency in the case where X-rays are directly converted into carriers, with respect to semiconductor thicknesses under a condition in which tungsten is used as a target and an accelerating voltage is set to be 120 kVp in an X-ray generation apparatus in the embodiment mode of the present invention.

The smaller the band gap Eg is, the smaller the necessary energy ε is and thus it is more efficient. However, with respect to a semiconductor material having a small band gap Eg, a dark current determined by the band gap Eg of a semiconductor becomes large and thus a noise is increased in the case where it is used for an X-ray sensor or a photo sensor. Use of a semiconductor material having a band gap of 1 eV or larger is preferable, since a radiation image pick-up device in which a dark current is decreased at a room temperature, a noise is low, and an S/N (signal to noise) ratio is large, can be obtained. FIG. 5 is an explanatory graph showing detection efficiency in the case where X-rays are directly converted into carriers, with respect to semiconductor thicknesses under a condition in which tungsten (W) is used as a target and an accelerating voltage is set to be 120 kVp in an X-ray generation apparatus. Since Si has a small element number, the detection efficiency thereof is low even in the case of a thickness of 1 mm. Ge, Se, and Gas indicate almost the same detection efficiency.

However, since the band gap of Ge is small, there is a problem in that a dark current in a detector becomes large. Although Se is currently used as amorphous Se in general, the amorphous Se is greatly deviated from the relationship of the equation (2) and energy $\epsilon$ of about 50 eV is required. With respect to Gas, a band gap Eg is about 1.5 eV, and with respect to X-ray absorption, X-ray detection efficiency is about 40% at a thickness of 0.5 mm. Thus, it is useful as X-ray detection semiconductor.

For example, when GOS described above is laminated at 200 μm, Gas is formed at 0.5 mm, and the calculation is made using the equation (1), since GOS is 0.3 and Gas is 0.7×0.4=0.28, a total becomes 0.58. Thus, detection efficiency of 58% can be achieved. Of course, a combination of other materials can be made. $PbI_2$, $HgI_2$, CDt, CdZnTe, and the like also have excellent X-ray absorption characteristic and a large band gap. Thus, these have excellent performance.

The thickness of the semiconductor layer to be practically useful as the radiation image pick-up device must be set to be a thickness capable of obtaining detection efficiency of at least 20%. From FIG. 5, it is preferable that a thickness is 200 μm or thicker in the cases of Se and Gas. The thickness capable of obtaining detection efficiency of 30% or higher is further desirable. In this case, a thickness becomes 400 μm or larger. Note that the thickness and the detection efficiency shown in FIG. 5 are dependent on incident radiation energy. In the case of low radiation energy, X-ray transmittance is reduced. On the other hand, when the radiation energy is high, since the transmittance is increased, the semiconductor thickness becomes large. Thus, the problem can be overcome by changing the thickness in accordance with a radiation source to be used.

Figure 6:
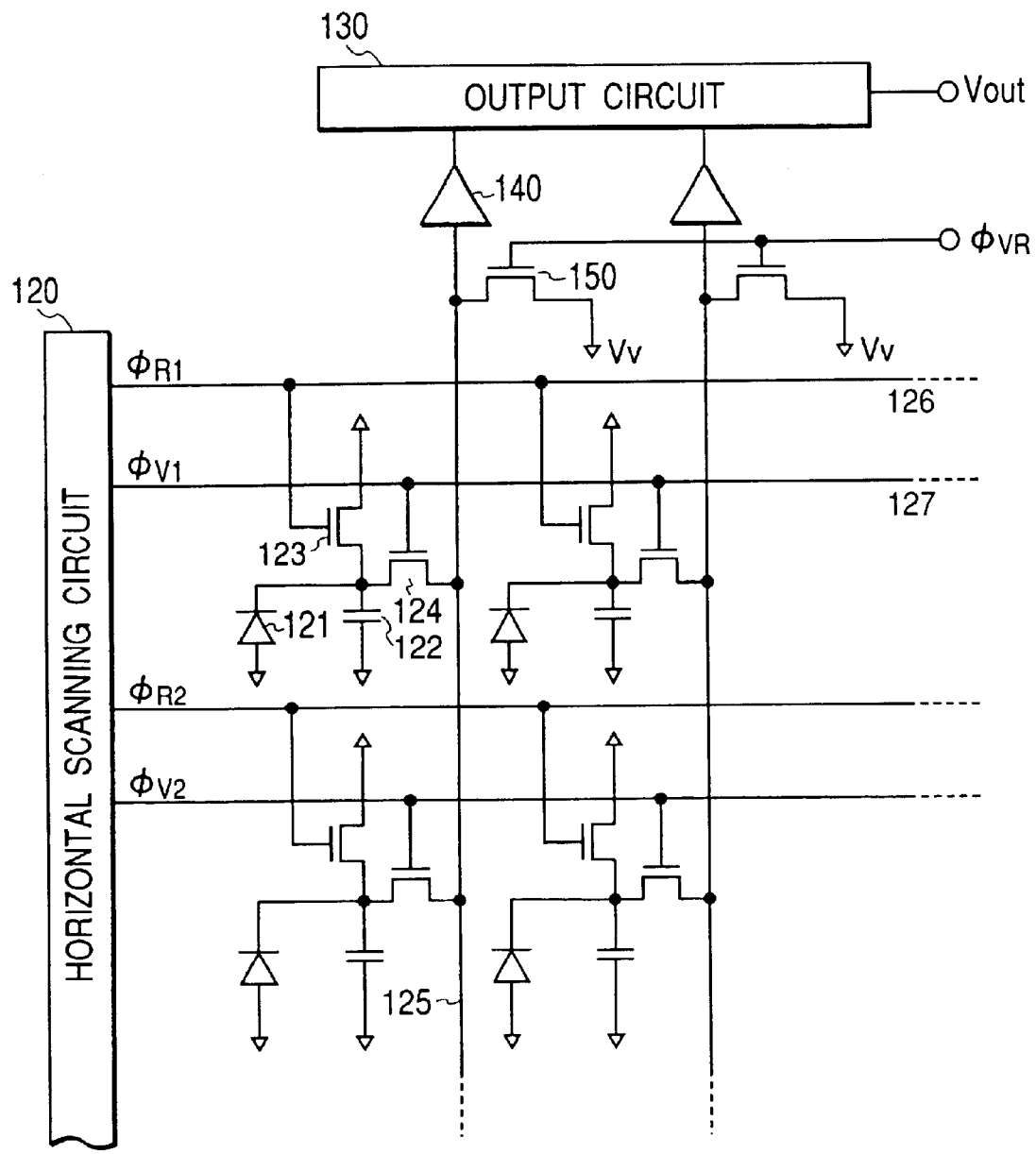
FIG. 6 is a circuit diagram indicating a schematic equivalent circuit of FIG. 1.

FIG. 6 is a circuit diagram indicating a schematic equivalent circuit of the radiation image pick-up device shown in FIG. 1. Reference numeral 121 denotes a radiation detection portion, 122 denotes a storage capacitor for storing detected carriers, 123 denotes a reset transistor for resetting the storage capacitor 122, and 124 denotes a read transistor for reading stored charges. One pixel is composed of these elements. Also, reference numeral 150 denotes a reset transistor for a read wiring, 125 denotes output lines, 140 denotes amplifiers connected with the respective output lines 125, 120 denotes a horizontal scanning circuit for supplying a read pulse (Φvi) and a reset pulse (ΦRi) for resetting a sensor cell, one pixel, and 130 denotes an output circuit. In FIG. 6, pixels are formed in a two dimensional arrangement to construct an area sensor. Here, the respective transistors are preferably made from a thin film transistor. The reason for this is as follows. That is, a carrier mobility of a thin film transistor in which a channel region is made of non-single crystalline semiconductor such as amorphous semiconductor or polycrystalline semiconductor is lower than that of a thin film transistor in which a channel region is made of single crystalline semiconductor. However, defects caused by grain boundaries, dangling bonds, and the like as the causes for this have a function of trapping undesirable charges produced by the incidence of high energy rays. Thus, an advantage of the non-single crystalline semiconductor thin film transistor that it is resistant to malfunction as compared with the single crystalline semiconductor thin film transistor, becomes apparent when it is applied to a radiation image pick-up devices used.

When as a conversion means a substrate that is difficult to be enlarged such as a single crystalline semiconductor substrate is used, a semiconductor substrate may be divided into plural regions, and the conversion means may be provided on a read circuit on an insulating substrate and electrically connected with respective input pixels.

Also, the following problem may arise. That is, when even after performing reading of charges in the storage capacitor 122 a portion of the charges remains slightly, since the remaining charges are added at the time of next storage, they become noises at the time of next readout, which visibly appear as after-images in the cases of moving images.

Therefore, the remaining charges are reset by the reset transistor 123 and thus the occurrence of the after image can be suppressed. In the case of moving image operation in particular, the after images can be reduced.

In the embodiment mode of the present invention, an amount of charge far in excess of a predetermined amount of charge to be stored in the storage capacitor 122 may be emitted by the transistor 123. A potential range of the storage capacitor 122 (a range of an amount of charge to be stored) can be determined. This will be described in details. An initial potential of the storage capacitor 122 immediately after resetting is set to be a reset standard potential VR1 by providing a sufficient on voltage to the transistor 123 to turn on the transistor 123. After resetting, charges are stored in the storage capacitor 122 by charges Q flowing from a conversion element 121. If an amount of charge exceeds a predetermined amount, there is a possibility that charges are leaked to the output line 125 through the read transistor 124. Thus, a final point of a potential (saturation potential) of the capacitor 122, which is caused by the produced charges, may be determined by a gate voltage provided to the gate of the transistor 123. For example, when a voltage provided to the gate in order to determine a potential VG of the gate is given as an off voltage VB, a final voltage of the capacitor 122 becomes VB−Vth (Vth is a threshold of the transistor 123). For example, when VB=Vth, the final voltage of the capacitor 122 becomes zero and thus a voltage range of the capacitor 122 becomes VR1 to 0 V.

Thus, according to the embodiment mode, the transistor 123 can serve as not only a reset switch but also an element for determining an operation range (dynamic range) of each pixel.

Figure 7:
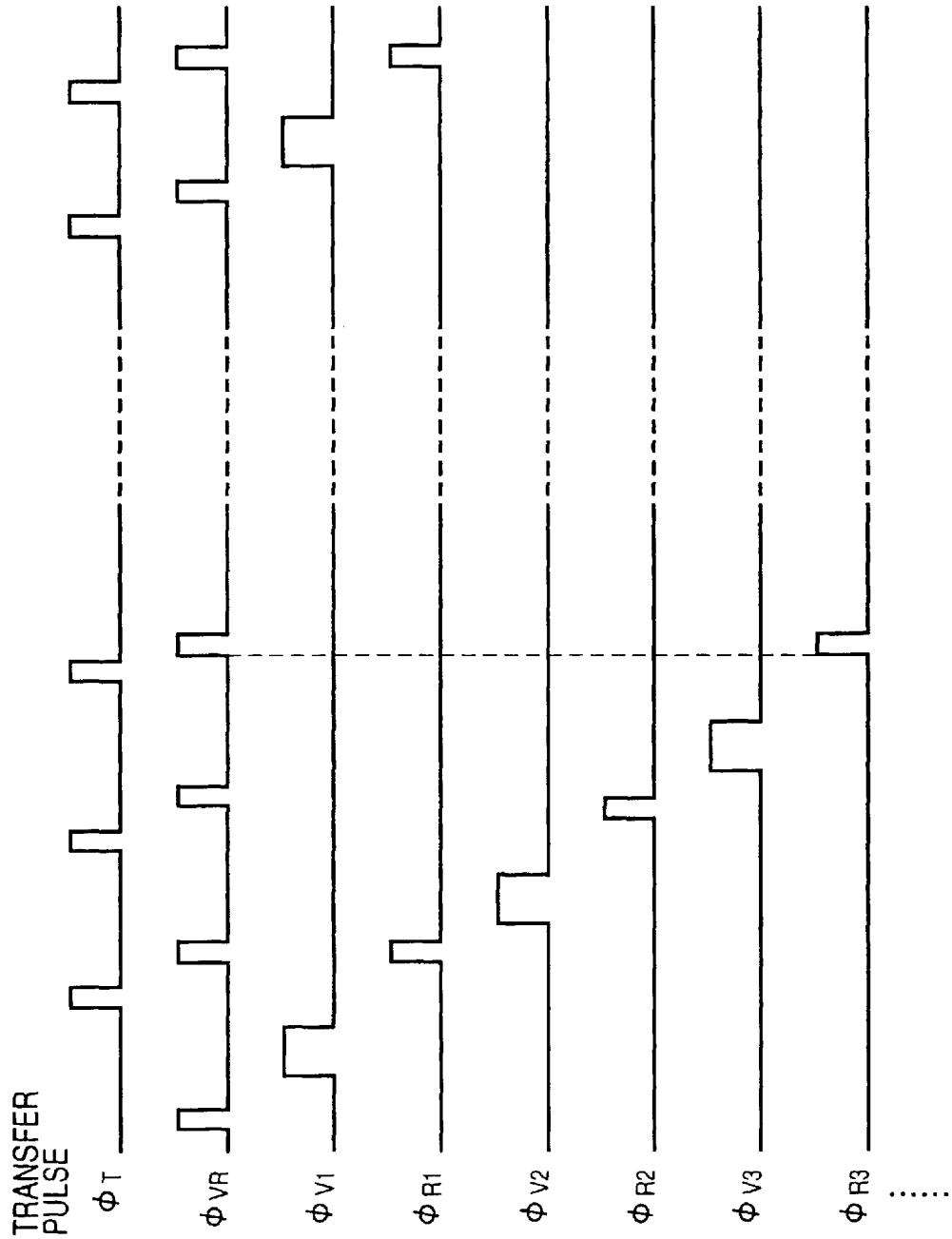
FIG. 7 is an explanatory diagram indicating operation timing of the circuit shown in FIG. 6.

FIG. 7 is an explanatory diagram indicating one example of operation timing of the equivalent circuit shown in FIG. 6. Reference symbol ΦVR denotes a signal line reset pulse, Φvi (i=1, 2, 3, . . . ) denotes a read pulse, and ΦRi (i=1, 2, 3, . . . ) denotes a sensor cell reset pulse. For example, a repeat time of a pulse of ΦR1 becomes a storage time of a carrier produced by an X-ray. When an X-ray is continuously irradiated onto the sensor, in the case of image taking of 30 times per second (30 FPS), the time becomes 1/30 sec.=33 msec. In the case of 60 images, the time becomes 1/60 sec.=16.5 msec.

Next, the operation of the embodiment mode of the present invention will be described in details with reference to FIGS. 6 and 7.

First, the reset transistor 123 is set to be a conductive state by ΦR1 to reset a sensor cell and then it becomes a storage time. After that, the signal line is reset by ΦVR and then read operation of the output line 125 is performed by the pulse of ΦV1. The read of charges to a floating capacitor of the output line 125 is performed and then, although not shown in FIG. 6, charges are transferred to the output circuit 130 by a transfer pulse ΦT. After that, the output circuit 130 outputs signals in order. In accordance with the successive operations of ΦR2, ΦVR, ΦV2, ΦT, ΦR3, . . . , charges are read from all pixels arranged on a two-dimensional plane.

Pulse times of on levels of ΦVRi, Φvi+1 and ΦT are determined by the number of images "m" per second (m FPS) and the number of pixels (n×n) and represented by the following equation:

$$\Phi VRi + \Phi vi+1 + \Phi T \leq 1/(m \times n) \text{ (seconds)} \quad (3).$$

As described above, according to the embodiment mode of the present invention, radiations are wavelength-converted into lights by the phosphor 40 and the lights are converted into charges in the semiconductor layer 30. Also, radiations which are not wavelength-converted by the phosphor are converted into charges in the semiconductor layer 30. Therefore, since the radiations are effectively detected, the detection efficiency can be increased by using both the phosphor 40 and the semiconductor layer 30. Also, aliasing can be removed by using the phosphor 40 as a spatial filter.

EMBODIMENT

Next, an embodiment of the present invention will be described.

Embodiment 1

Figure 9:
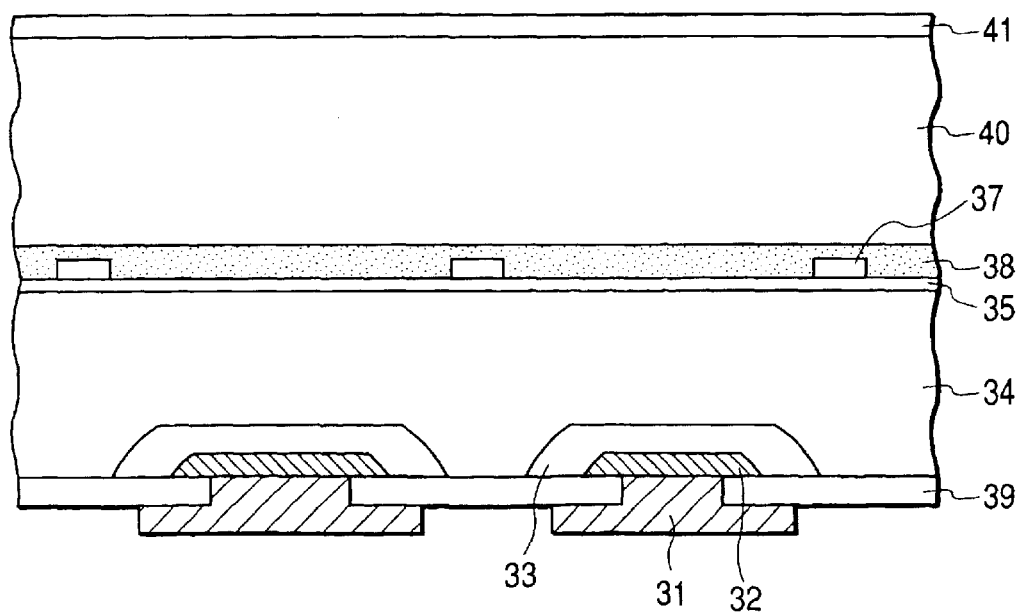
FIG. 9 is a cross sectional view indicating a sensor structure in which an electrode of a light receiving part in a pn junction is partially removed in another embodiment mode.

FIG. 9 is a schematic cross sectional view indicating a structure in which electrodes for applying a bias voltage to a pn junction are partially provided on a light receiving surface. Electrodes 37 made of metal such as aluminum are partially provided in the phosphor 40 side of the semiconductor layer. According to such a structure, even if a transparent electrode is not used, incident lights from the phosphor 40 can be effectively led. Also, although a portion of the incident lights is shielded, electrodes with a stripe shape or in a mesh shape may be also provided in a central portion upon which lights are incident. Reference numerals 38 and 39 denote protective films.

Figure 10:
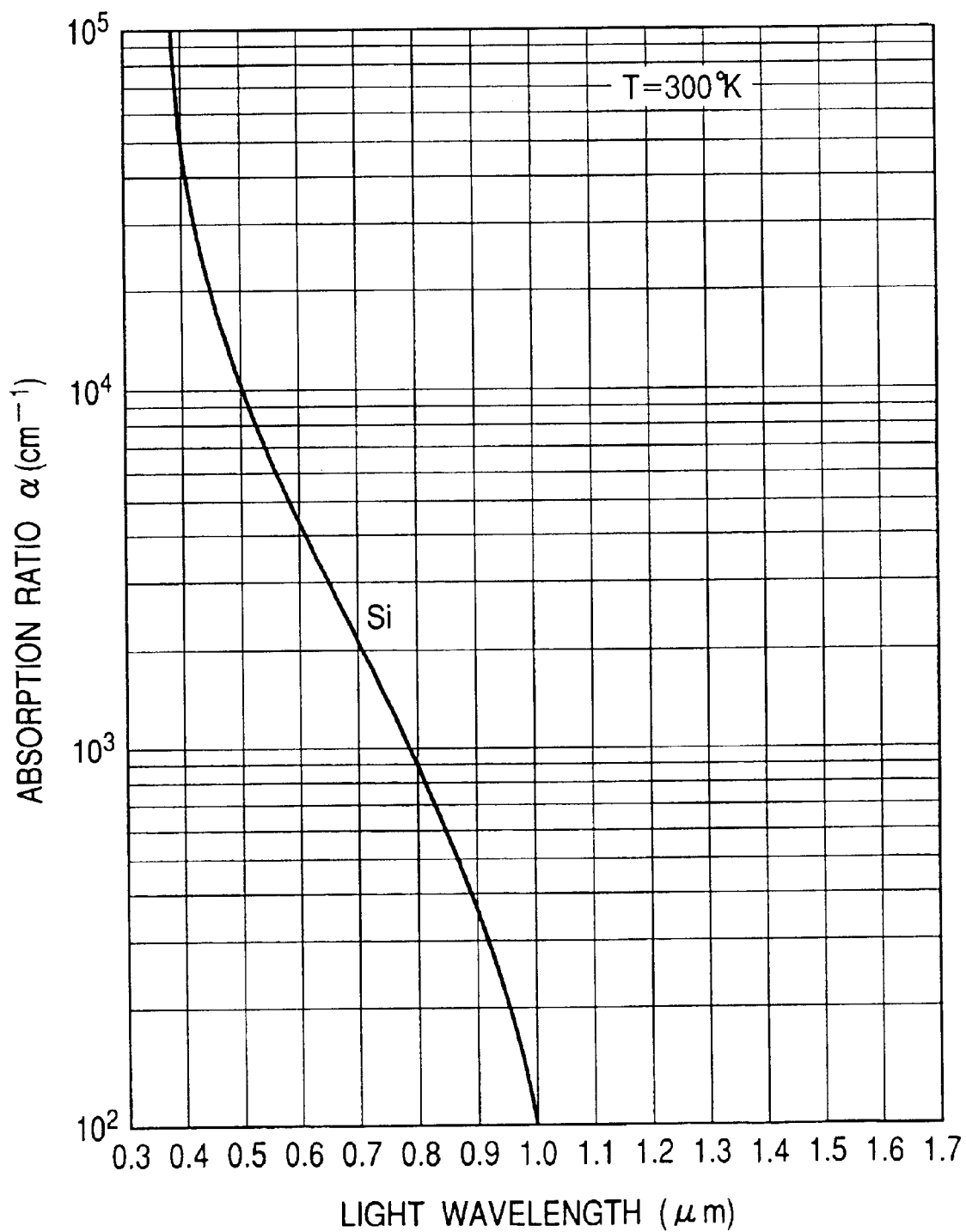
FIG. 10 is an explanatory graph showing a light absorption characteristic in the embodiment mode of the present invention.

FIG. 10 is an explanatory graph of a light absorption characteristic. The abscissa indicates a light wavelength and the ordinate indicates an absorption ratio, that is, an absorption ratio of Si. For example, with respect to a light emission wavelength of phosphors of GOS and CsI:Tl, an absorption ratio in the case of a green color is about 6000 cm$^{-1}$, and an intrusion distance (λ) into Si semiconductor is about 1.6 µm. That is, light absorption of 63% is performed at a distance of 1.6 µm. However, the semiconductor region 35 having a high impurity concentration becomes a dead band in a photo sensor. Thus, this region is preferably formed thin and its thickness is preferably set to be about ⅕ of an intrusion distance (λ), that is, of an absorption ratio or less. A thickness required as the depletion layer in a semiconductor layer or a thickness required for absorbing light and converting it into charge is preferably 3λ or more. A thickness of the semiconductor layer becomes larger than the thickness. This is the same in the embodiment mode shown in FIG. 1.

Embodiment 2

Figure 11:
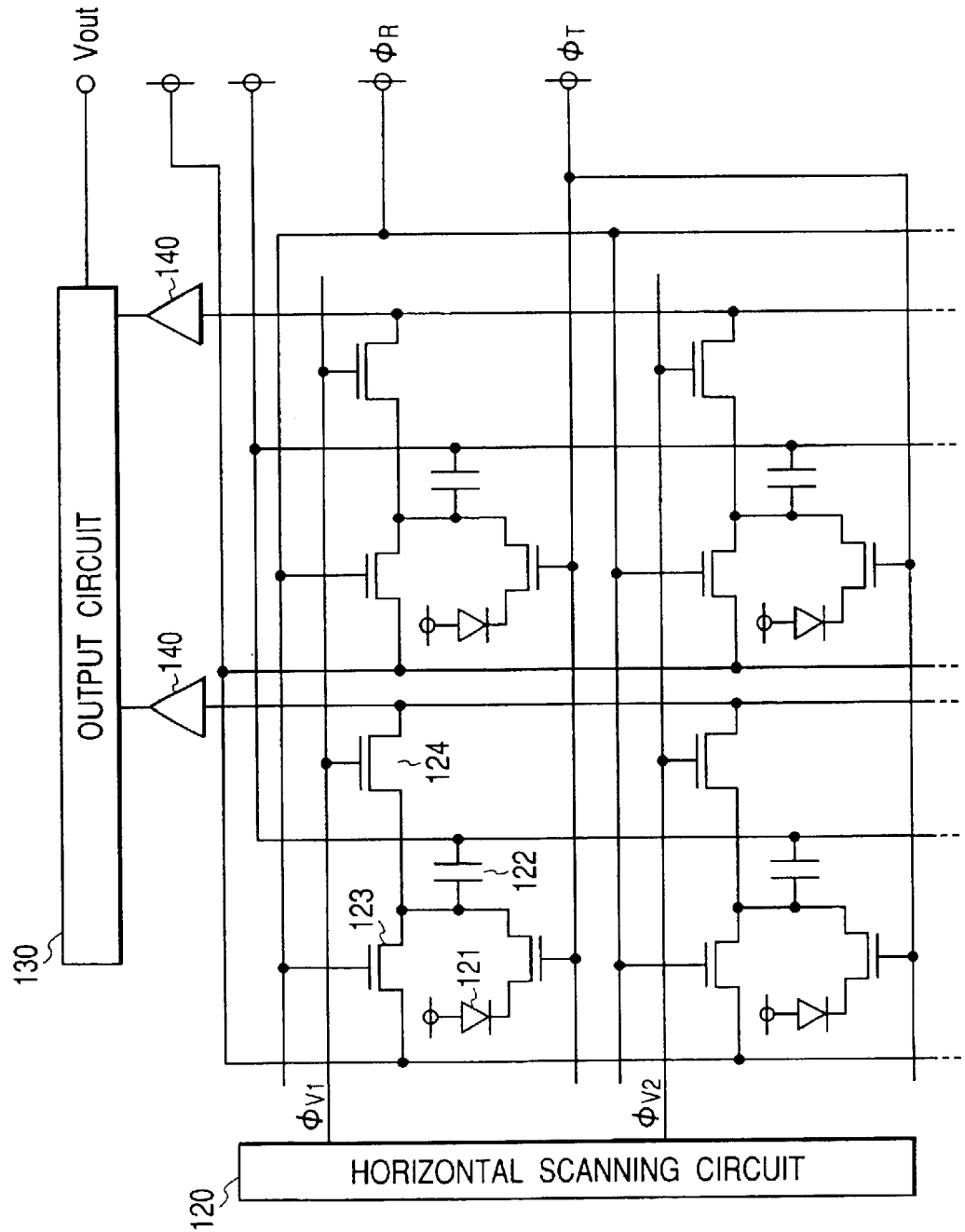
FIG. 11 is a circuit diagram indicating a structure of a sensor cell of another embodiment mode.

FIG. 11 is a circuit diagram indicating an example of a schematic equivalent circuit of a radiation image pick-up device (sensor cell) and an embodiment mode in which a TFTS is formed between a radiation detection portion 121 and a storage capacitor. Note that the same structure elements as in FIG. 6 are referred to by the same reference symbols and thus the description is omitted here. This TFTS has a function of keeping an electric field in the detection portion 121 constant. The electric field in the detection portion 121 is kept constant and thus stable radiation detection by a sensor is attained.

Figure 12:
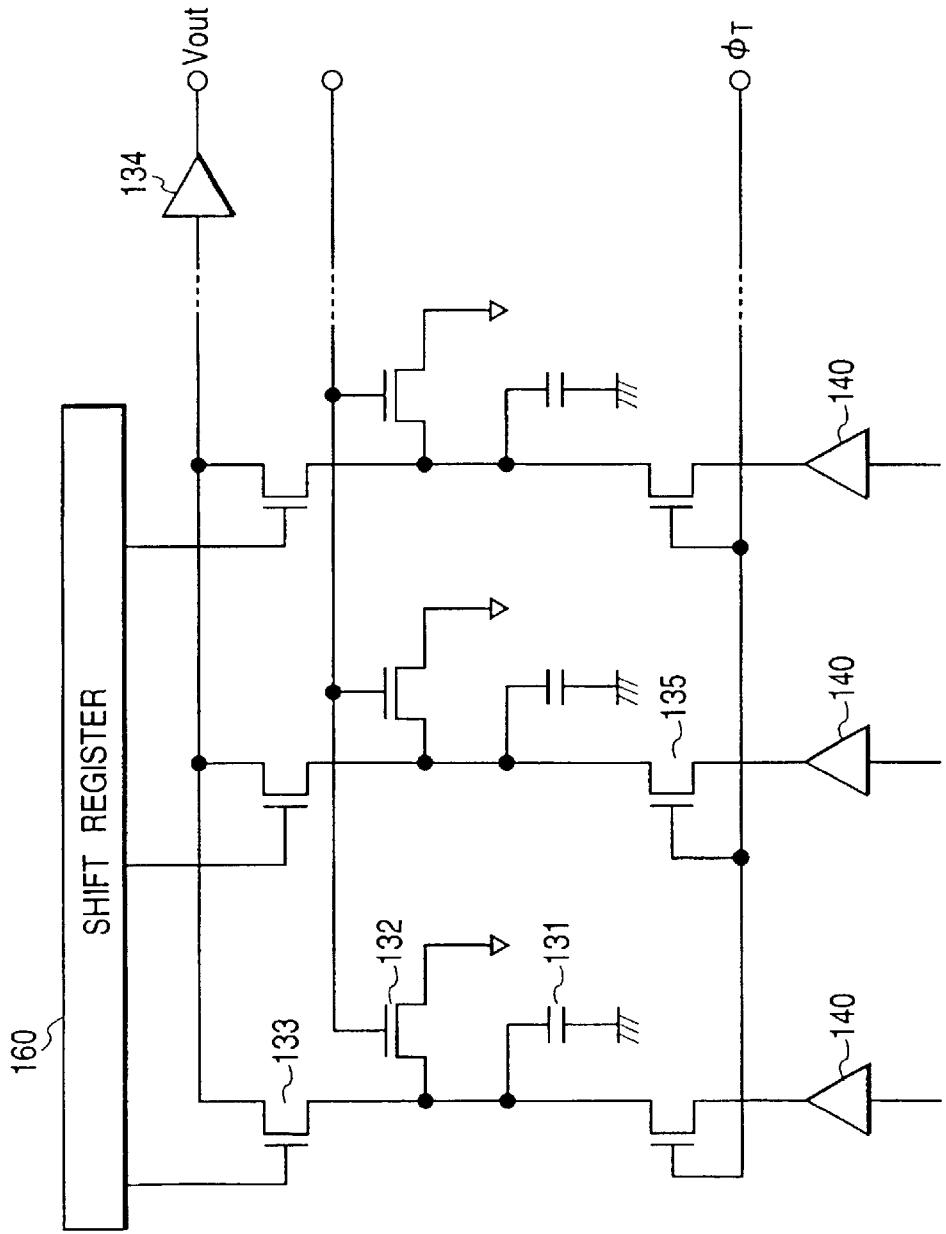
FIG. 12 is a circuit diagram indicating details of an output circuit of another embodiment mode.

FIG. 12 is a circuit diagram indicating an embodiment mode of the output circuit 130 shown in FIG. 11. The output circuit 130 is composed of sampling capacitors 131, reset TFTs 132 for resetting charges in the sampling capacitors 131, shift registers 160, TFTs 133 for performing read operation in order in response to pulses from the shift registers 160, a buffer amplifier 134, and transfer TFTs 135.

Embodiment 3

Figure 13:
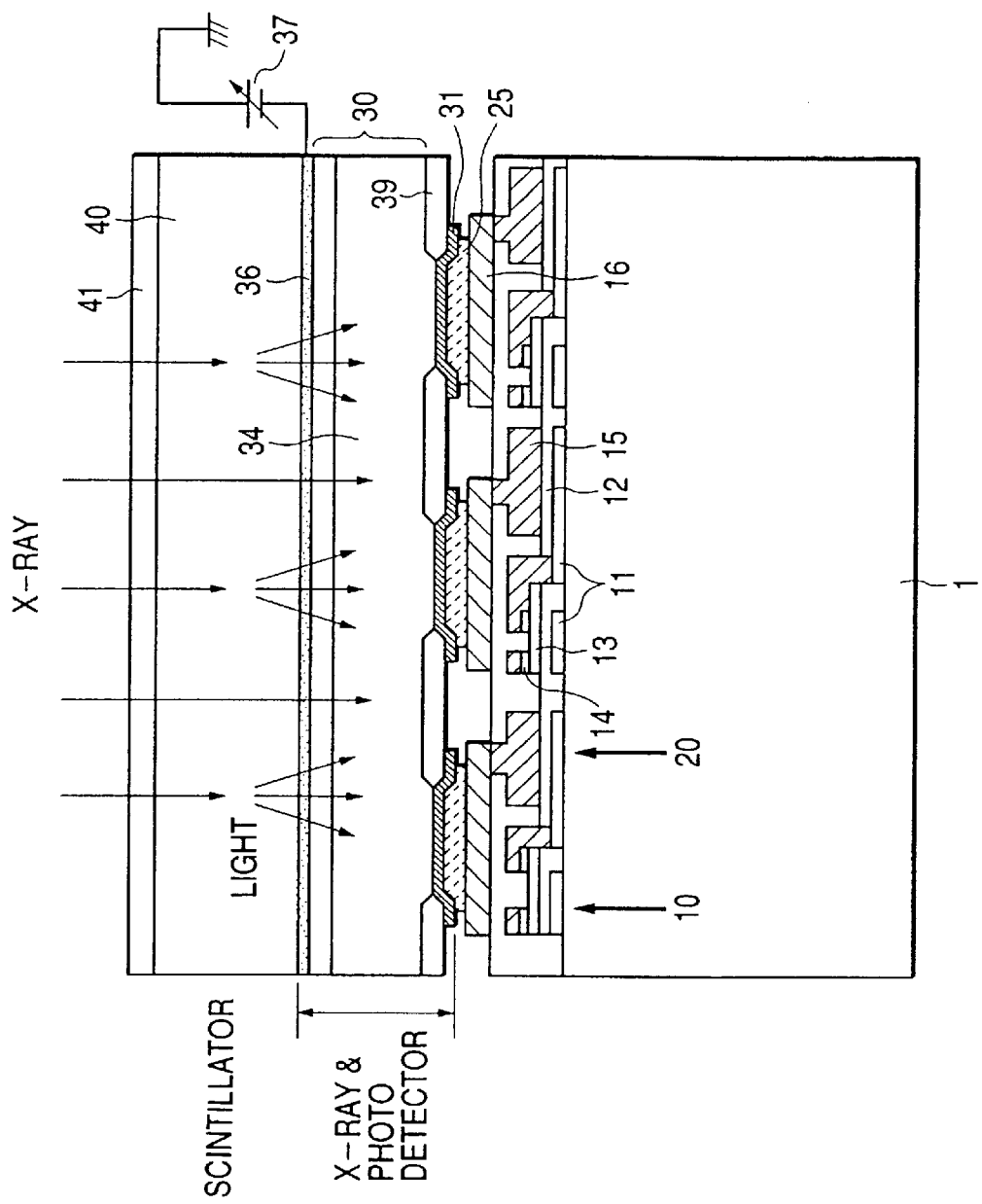
FIG. 13 is a cross sectional view indicating a schematic structure of a radiation image pick-up device of another embodiment mode.

FIG. 13 is a cross sectional view indicating another example of a charge conversion means. In FIG. 13, a semiconductor layer 30 is not of a pn junction type but of a conductivity modulation type. If the semiconductor layer 30 has a high resistance, even when a high voltage is applied thereto, a dark current is small and thus a carrier produced by an X-ray and a carrier produced from light can be detected. This embodiment is characterized in that a step of manufacturing the charge conversion means is simplified. For example, it can be applied in the case of amorphous selenium (a-Se) having a resistivity of 1E11 Ωcm or larger or Gas or InP which is a semi-insulating semiconductor material having a resistivity of about 1E8 Ωcm or larger. Reference numeral 34 denotes a high resistance semiconductor. It is required that the high resistance semiconductor 34 has such a thickness that radiation can be sufficiently detected and the detection efficiency shown in FIG. 5 is 0.2 or larger. Reference numeral 36 denotes a transparent electrode. The electrode is located so as to apply a voltage to the semiconductor layer 30.

Embodiment 4

Figure 14:
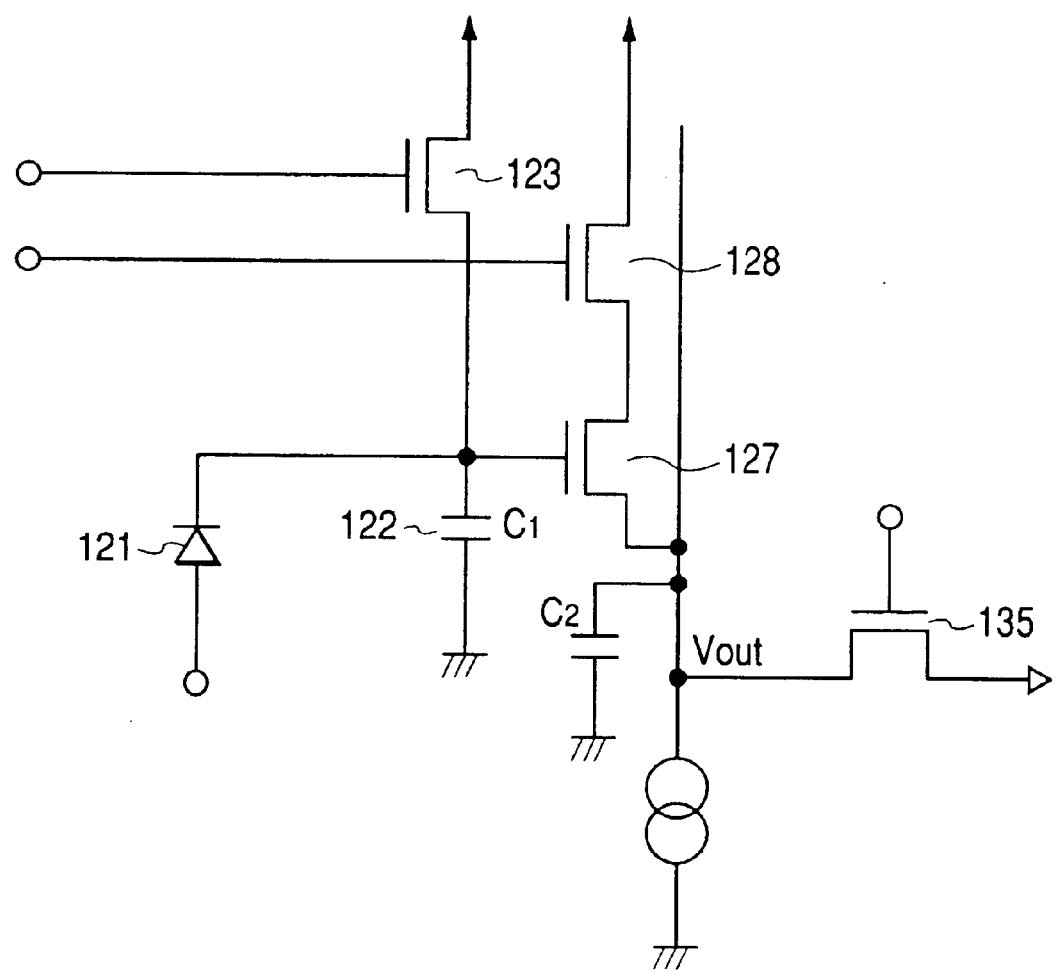
FIG. 14 is a circuit diagram indicating a structure of a sensor cell of another embodiment mode.

FIG. 14 is a circuit diagram indicating another circuit example of a sensor cell. In this circuit, charges are read from a storage capacitor 122 through an amplifier of a source follower. The source follower is composed of transistors 127 and 128 and charge-amplifies charges stored in the capacitor 122. A signal to a noise can be improved by the charge amplification. Reference numeral 135 denotes a transfer transistor. Reference symbol C2 denotes a parasitic capacitor with respect to a wiring.

Figure 15:
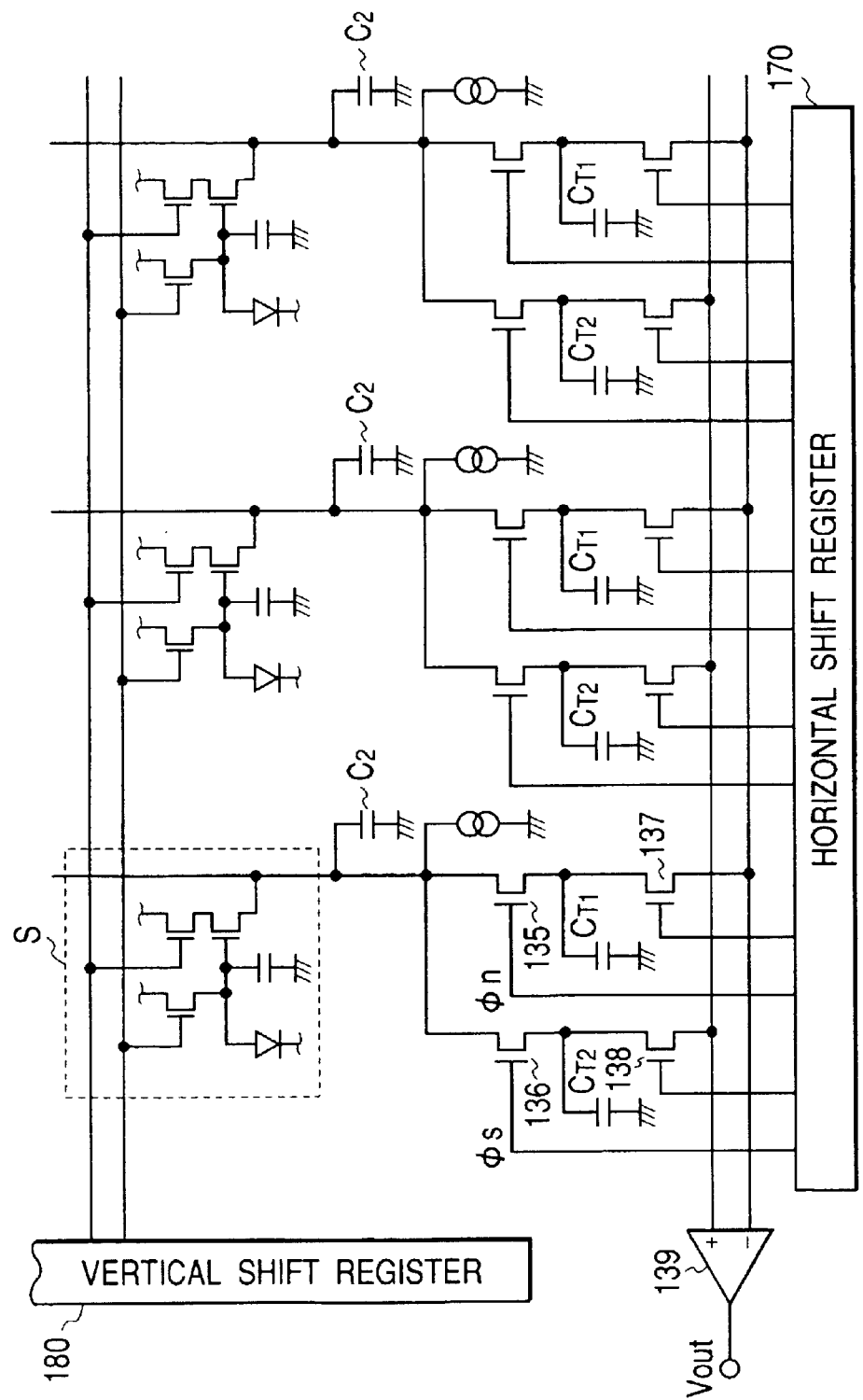
FIG. 15 is a circuit diagram indicating a structure of an output circuit of another embodiment mode.

FIG. 15 is a circuit diagram indicating an example of an output circuit. The output circuit has two transfer transistors 135 and 136 and charge holding capacitors CT1 and CT2. A noise (N) is stored in the capacitors CT1 by a pulse of Φn. After the sensor cell is irradiated with an X-ray, a signal and a noise (S+N) are stored in the capacitor CT2 by a pulse of Φs. Then, a signal (S) is outputted from a differential amplifier 139, which is obtained by (S+N)−(N)=S. In the drawing, reference numeral 170 denotes a horizontal shift register and 180 denotes a vertical shift register.

Embodiment 5

Figure 16:
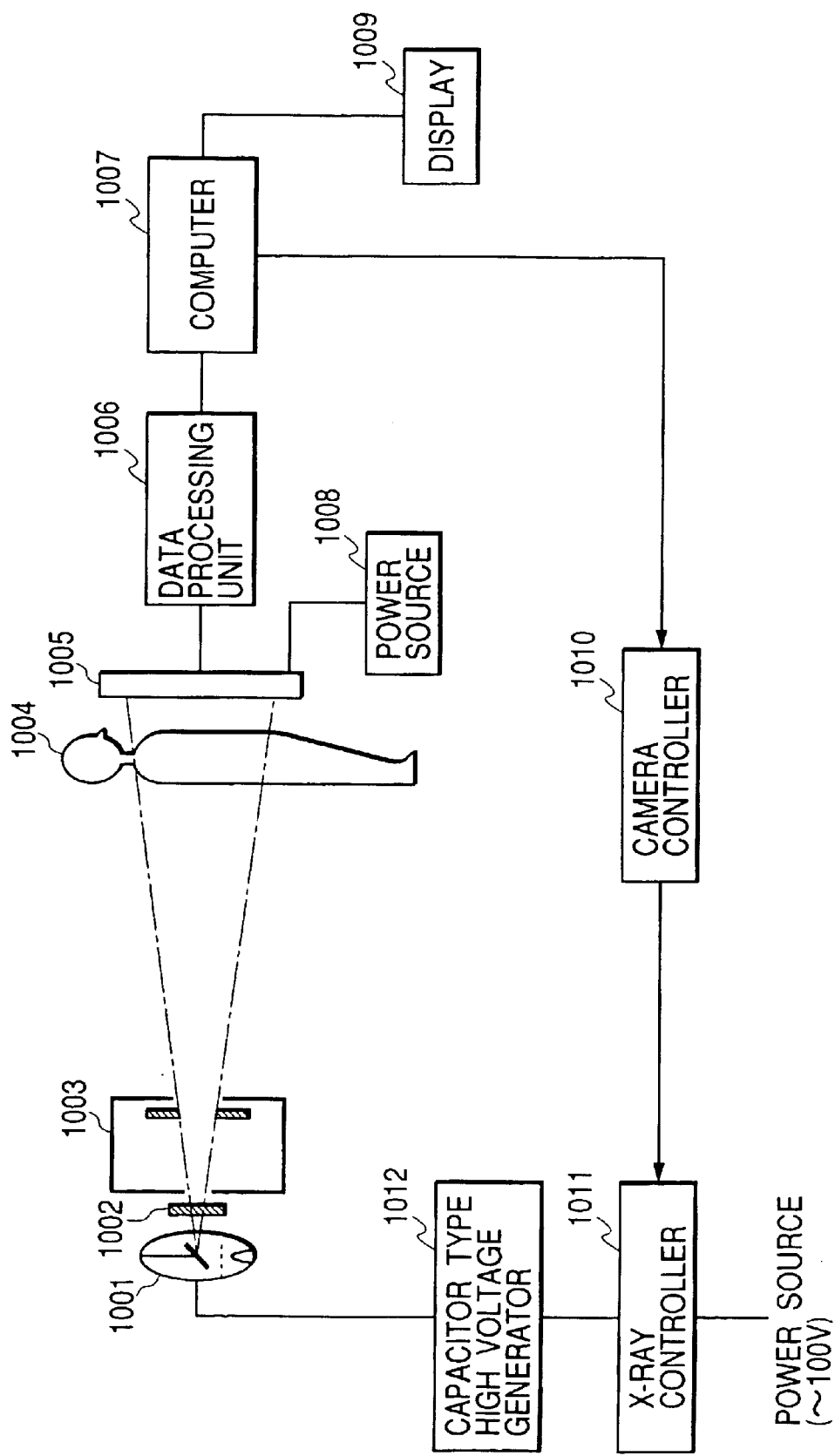
FIG. 16 is a schematic view indicating one example of a medical diagnostic apparatus using the radiation image pick-up device of the present invention.

FIG. 16 is a schematic view indicating one example of a medical diagnostic apparatus using the radiation image pick-up device of the present invention. In FIG. 16, reference numeral 1001 denotes an X-ray tube as an X-ray generation source, 1002 denotes an X-ray shutter which is opened or closed for X-ray transmission control, 1003 denotes an irradiation cylinder or a movable diaphragm, 1004 denotes a subject to be imaged, 1005 denotes a radiation detector using the radiation image pick-up device of the present invention, and 1006 denotes a data processing unit for data-processing signals from the radiation detector 1005. Reference numeral 1007 denotes a computer. The computer causes a display 1009 such as a CRT to display an X-ray image and the like in accordance with a signal from the data processing unit 1006 and controls the X-ray tube 1001 through a camera controller 1010, an X-ray controller 1011, a capacitor type high voltage generator 1012 to control an amount of radiation to be generated In the case of a high energy ray such as an X-ray, with respect to radiation having been transmitted through the subject to be imaged and radiation which has been transmitted through air without transmitting through the subject to be imaged, since an amount of energy incident upon a conversion element is extremely different, a difference of an amount of charge to be produced is extremely large. Thus, from a difference of an amount of charge to be produced between a subject image and its background, the charge storage amount is easily saturated in the background portion. According to the present invention, in the case where the radiation is detected, the wavelength converter for converting radiations into lights is provided and a charge conversion layer for converting radiations transmitted through the wavelength converter and the lights converted by the wavelength converter into charges is further provided. Thus, even if an amount of energy of incident high energy rays is large, they can be effectively converted into charges. Also, since excess charges are discharged through thin film transistors, a reduction in image quality caused by such excess charges can be effectively prevented. Further, since thin film transistors are used, even if high energy rays are incident upon the thin film transistor portion, they are resistant to malfunction which is caused by such incidence. Furthermore, an area of a detection device can be easily increased.

Embodiment 6

Figure 17A:
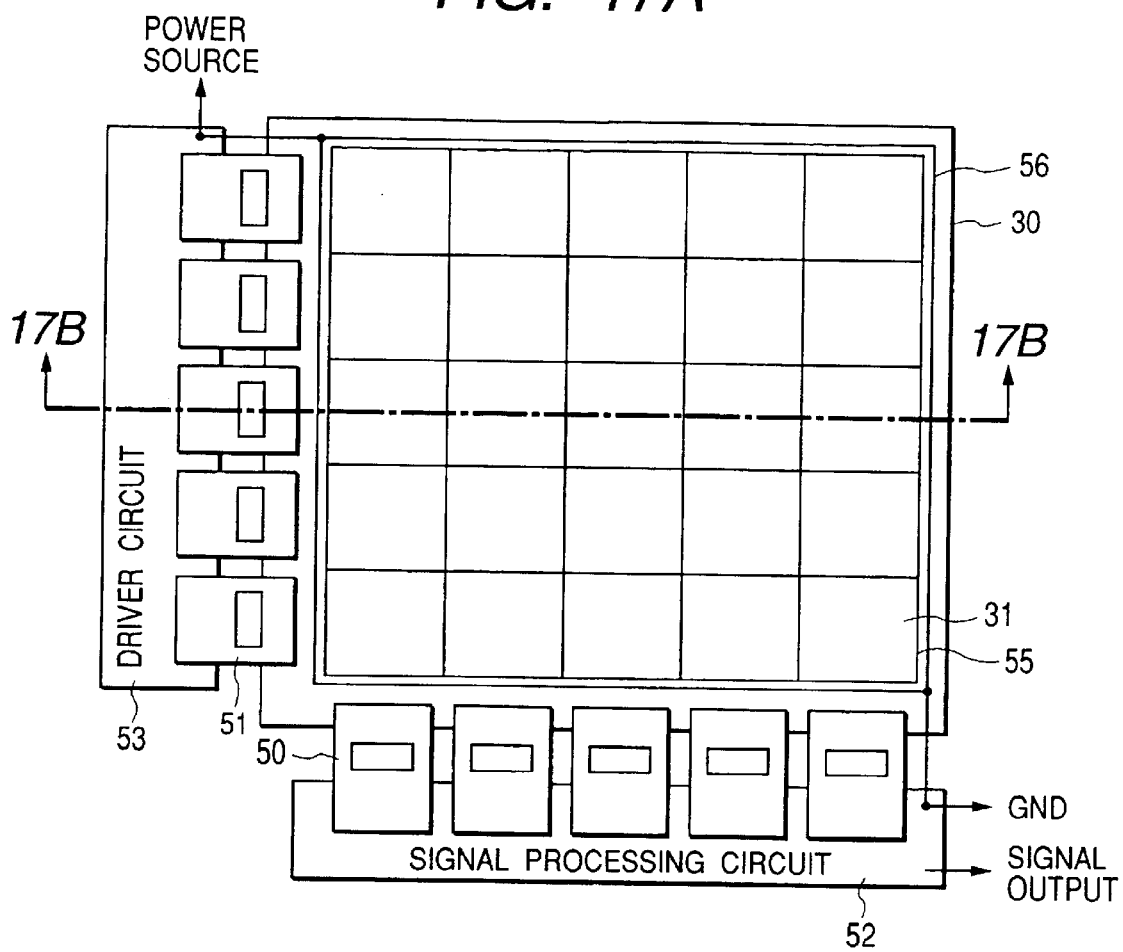
FIGS. 17A and 17B are a schematic plan view and a schematic cross sectional view of an X-ray detector according to an embodiment of the invention.
Figure 17B:
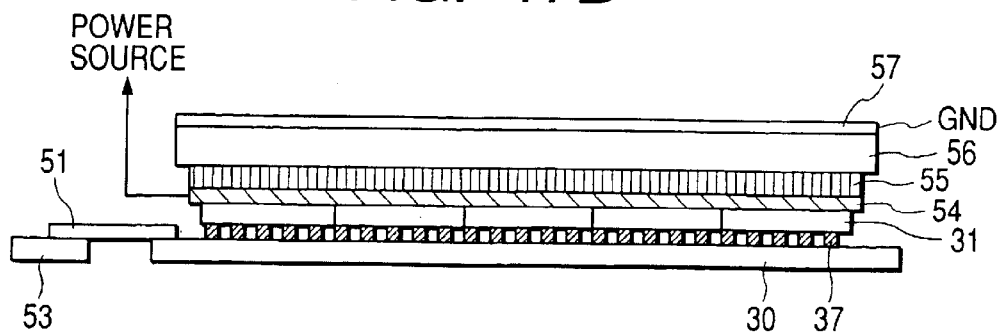

FIGS. 17A and 17B are a schematic plan view and a schematic cross sectional view of an X ray detector according to an embodiment of the invention.

Referring to FIGS. 17A and 17B, a plurality of conversion elements 31 are arranged in two-dimensionally matrix on a common detector 30 comprising thin film reset transistors and thin film read transistors formed on an insulating substrate typically made of glass. Each of the conversion elements 31 and the detector 30 are connected to each other through bumps 37.

The signal processing circuit of the device comprises a plurality of signal processing circuit chips 50 provided in the form of tape carrier packages adapted to process signals from a predetermined number of output lines 125 and a common printed wired board 52 for connecting them. Each signal processing circuit chip 50 includes an amplifier 15, an output circuit 130 and a transistor 150, which are described earlier.

Similarly, the driver circuit of the device comprises a plurality of driver circuit chips 51 provided in the form of tape carrier packages adapted to drive a predetermined number of drive control lines and a common printed wired board 53 for connecting them. Each driver circuit chip 51 includes a scan circuit 120 and a reset circuit.

The chips 50 and 51 are those of monolithic integrated circuits where transistors are formed in a monocrystalline semiconductor substrate.

When polycrystalline thin film transistors or monocrystalline thin film transistors is used for the thin film transistors, the signal processing circuit and the driver circuit may entirely or partly be formed by using CMOS type thin film integrated circuits comprising polycrystalline thin film transistors or monocrystalline thin film transistors arranged on the substrate 1 in such a way that they are integrated with a plurality of unit cells on the substrate 1. This arrangement is advantages in that it can reduce the number of connection terminals to be used externally relative to the substrate 1 to consequently simplify the assembling operation.

In FIGS. 17A and 17B, reference numeral 54 denotes a single sheet of conductor for short-circuiting the plurality of conversion elements 31 and commonly biassing them. While the conductor 54 is a transparent electrode layer which transmits light from the phosphor or radiation. In this embodiment, the conductor 54 is in the form of sheet, may alternately be meshed form. Reference numeral 55 denotes a wave converter having a phosphor such as CsI, 56 denotes a sheet for shielding the biassing conductor 54. A higher voltage than 100 V is applied to the conductor 54, and hence requires a protection sheet 57. Particularly, when the detector is used for medical applications, the provision of the sheet 57 is highly desirable so that the conductor to which a high voltage is applied is held remote from any human body.

The insulating sheet 56 may not necessarily be arranged between the conductor 54 and the sheet 57. It may be replaced by an air gap. If such is the case, the shield 54 is arranged between the conductor and the housing of the detector.

Thus, in case of dividing semiconductor substrate into plural ones, which constitute the conversion element, the whole structure can be made larger easily.

What is claimed is:

1. A radiation pick-up device, comprising:

a plurality of pixels;

a wavelength converter for converting incident radiation into light;

conversion means for converting the radiation passing through said wavelength converter and the light converted by said wavelength converter into a charge;

storage means for storing the charge;

reading means for reading a signal corresponding to the charge stored in said charge storage means; and a plurality of output lines for outputting the charges read from said plurality of pixels, said plurality of output lines being connected to said plurality of pixels;

wherein said conversion means is formed and laminated over said storage means and said reading means.

2. The radiation image pick-up device according to claim 1, further comprising first reset means for resetting the charge in said storage means.

3. The radiation image pick-up device according to claim 1, wherein said plurality of pixels, said output lines, and said first reset means are respectively formed on an insulating substrate, said first reset means includes a reset thin film transistor, and each of said plurality of pixels includes a read thin film transistor.

4. The radiation image pick-up device according to claim 1, wherein said reset thin film transistor and said read thin film transistor are made of a non-single crystalline semiconductor.

5. The radiation image pick-up device according to claim 1, further comprising a transparent electrode that is located between said wavelength converter and said charge conversion means and transmits the light converted by said wavelength converter.

6. The radiation image pick-up device according to claim 1, wherein said conversion means has a semiconductor substrate for converting radiation into charge and a plurality of divided electrodes provided in correspondence with said plurality of pixels formed on an insulating substrate, said semiconductor substrate and the insulating substrate are laminated, and the plurality of divided electrodes and storage capacitors of said plurality of pixels are electrically connected with each other.

7. The radiation image pick-up device according to claim 1, wherein said semiconductor substrate is divided into plural regions.

8. The radiation image pick-up device according to claim 1, further comprising amplifiers for signal amplification in said plurality of output lines.

9. The radiation image pick-up device according to claim 1, wherein said charge conversion means is formed in a semiconductor substrate and has a pn junction portion.

10. The radiation image pick-up device according to claim 1, wherein said charge conversion means has an energy band gap of at least 1 eV or larger.

11. The radiation image pick-up device according to claim 1, further comprising a second reset means for resetting said plurality of output lines, said second reset means connected to said plurality of output lines.

12. The radiation image pick-up device according to claim 1, wherein said read means is composed of a thin film transistor made of non-single crystalline semiconductor.

13. The radiation image pick-up device according to claim 1, wherein said charge storage means and said read means are formed on said insulating substrate in a same layer structure having a lower electrode, a dielectric film, a high resistance semiconductor layer, a low resistance semiconductor layer, and an upper electrode.

14. The radiation image pick-up device according to claim 1, wherein said charge conversion means is made of a semi-insulating semiconductor.

15. The radiation image pick-up device according to claim 1, wherein said wavelength converter includes a phosphor.

16. The radiation image pick-up device according to claim 1, further comprising a reflective layer on a radiation incident side of said wavelength converter.

* * * * *